(12) United States Patent
Goode et al.

(10) Patent No.: US 11,978,524 B2
(45) Date of Patent: *May 7, 2024

(54) CUMULATIVE WORDLINE DISPERSION AND DEVIATION FOR READ SENSE DETERMINATION

(71) Applicant: Western Digital Technologies, Inc., San Jose, CA (US)

(72) Inventors: Jonas Goode, Lake Forest, CA (US); Richard Galbraith, Rochester, MN (US); Henry Yip, Bellflower, CA (US); Vinh Hoang, Laguna Hills, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 345 days.

This patent is subject to a terminal disclaimer.

(21) Appl. No.: 17/412,159

(22) Filed: Aug. 25, 2021

(65) Prior Publication Data
US 2023/0062048 A1 Mar. 2, 2023

(51) Int. Cl.
*G11C 16/04* (2006.01)
*G06F 3/06* (2006.01)
*G06F 11/10* (2006.01)
*G11C 29/12* (2006.01)
*G11C 29/44* (2006.01)

(52) U.S. Cl.
CPC ........ *G11C 29/4401* (2013.01); *G06F 3/0679* (2013.01); *G06F 11/1008* (2013.01); *G11C 29/12* (2013.01); *G11C 2029/1202* (2013.01)

(58) Field of Classification Search
CPC ................ G11C 29/4401; G11C 29/12; G11C 2029/1202
See application file for complete search history.

(56) References Cited

U.S. PATENT DOCUMENTS

| | | |
|---|---|---|
| 8,000,135 B1 | 8/2011 | Perlmutter et al. |
| 8,923,062 B1 | 12/2014 | Lee et al. |
| 9,269,448 B2 | 2/2016 | Tang et al. |

(Continued)

OTHER PUBLICATIONS

Berahas et al. "A theoretical and empirical comparison of gradient approximations in derivative-free optimization," arXiv preprint arXiv:1905.01332, Dec. 31, 2019, pp. 3-4, 12.

(Continued)

*Primary Examiner* — Pho M Luu
(74) *Attorney, Agent, or Firm* — PATTERSON + SHERIDAN, LLP

(57) ABSTRACT

A data storage device includes a memory device including a plurality of wordlines, each wordline having a plurality of cells, and a cell statistics generator (CSG) disposed on the memory device. The CSG includes logic configured to receive a plurality of left read senses and a plurality of right read senses for the plurality of cells of a wordline, determine a plurality of first windows and a plurality of second windows, determine a left window sum and a right window sum, determine a deviation parameter and a dispersion parameter based on the left window sum and the right window sum, and determine one or more characteristics of the plurality of cells based on the deviation parameter and the dispersion parameter. The deviation parameter and the dispersion parameter are used to describe a number of errors of the left read sense and the right read sense.

20 Claims, 6 Drawing Sheets

(56) References Cited

U.S. PATENT DOCUMENTS

| | | |
|---|---|---|
| 9,484,098 B1 | 11/2016 | Hsu et al. |
| 9,741,431 B2 | 8/2017 | Kumar et al. |
| 9,842,023 B2 | 12/2017 | Tang et al. |
| 10,236,070 B2 | 3/2019 | Barndt et al. |
| 10,347,331 B2 | 7/2019 | Zhang et al. |
| 11,656,789 B2 * | 5/2023 | Goode .................. G06F 3/0655 711/154 |
| 2016/0148702 A1 | 5/2016 | Karakulak et al. |
| 2016/0357631 A1 | 12/2016 | Cohen |
| 2019/0102084 A1 | 4/2019 | Zhang et al. |
| 2019/0354313 A1 | 11/2019 | Sheperek et al. |
| 2019/0391865 A1 | 12/2019 | Cadloni et al. |
| 2020/0105353 A1 | 4/2020 | Sharon et al. |
| 2022/0319587 A1 * | 10/2022 | Sarpatwari ............. G11C 16/24 |
| 2022/0319606 A1 * | 10/2022 | Sarpatwari .......... G06F 11/1048 |
| 2023/0063666 A1 * | 3/2023 | Goode .................. G11C 29/44 |

OTHER PUBLICATIONS

International Search Report and the Written Opinion for International Application No. PCT/US2020/066898, dated Mar. 3, 2021, 17 pages.

Kelley, C.T. "Iterative methods for optimization," Society for Industrial and Applied Mathematics, 1999, Dec. 31, 1999, pp. 17, 39-52.

Pulkkinen, S. "A Review of Methods for Unconstrained Optimization: Theory, Implementation and Testing," 2008, available at <https://core.ac.uk/download/pdf/14916847.pdf>, Dec. 31, 2008, Chapter 2.3. Gradient Descent Methods, pp. 13-36; Appendix A.5 Finite-Difference, Approximations, pp. 98-99.

Wikipedia Contributors, (Jun. 18, 2020). Finite difference. In Wikipedia, The Free Encyclopedia. Retrieved 13:49, Mar. 1, 2021, from URL <https://en.wikipedia.org/w/index.php?title=Finite_difference&oldid=963179578>, Jun. 18, 2020 (Jun. 18, 2020), Ch. "Relation with derivatives".

* cited by examiner

CUMULATIVE WORDLINE DISPERSION AND DEVIATION FOR READ SENSE DETERMINATION

BACKGROUND OF THE DISCLOSURE

Field of the Disclosure

Embodiments of the present disclosure generally relate to error detection in a non-volatile memory (NVM) device, and more particularly, to setting voltage read levels in an NVM device.

Description of the Related Art

When reading data from a non-volatile memory (NVM) device such as a NAND, NOR, or other type of NVM device, voltages from cells on a wordline are read at a programmed hard decode voltage level. However, errors in cell voltage levels may be introduced by variances in device temperature, vibration, and/or wear, in addition to errors that may have been introduced during manufacturing, in addition to retention and program erase cycle degradation during use.

When a hard decode read is determined to be in error, one or more soft decode read voltage levels, typically placed about the hard decode voltage are used in error correction. Conventionally, soft decode voltage levels may be statically placed, using predetermined values that may not be responsive to conditions that cause errors to be generated outside of the predetermined voltages. In response, some data storage devices implement a 'valley search' method to provide adjustment to soft decode voltage levels, however valley search that seeks to optimize voltage hard decode read level positions, by finding the bottom of a shallow bit error rate (BER) valley. However, valley search may find incorrect local values for adjustment of hard decode voltages as it is susceptible to noise and unsymmetrical cell distributions, resulting in little to no performance improvement in detection or correction of errors.

What is needed are systems and methods to mitigate issues of prior approaches.

SUMMARY OF THE DISCLOSURE

The present disclosure generally relates to error detection in a non-volatile memory (NVM) device, and more particularly, to setting voltage read levels in an NVM device. A data storage device includes a memory device including a plurality of wordlines, each wordline having a plurality of cells, and a cell statistics generator (CSG) disposed on the memory device. The CSG includes logic configured to receive a plurality of left read senses and a plurality of right read senses for the plurality of cells of a wordline, determine a plurality of first windows and a plurality of second windows, determine a left window sum and a right window sum, determine a deviation parameter and a dispersion parameter based on the left window sum and the right window sum, and determine one or more characteristics of the plurality of cells based on the deviation parameter and the dispersion parameter. The deviation parameter and the dispersion parameter are used to describe a number of errors of the left read sense and the right read sense.

In one embodiment, a data storage device includes a memory device including a plurality of wordlines, each wordline having a plurality of cells, and a cell statistics generator (CSG) disposed on the memory device. The CSG includes logic configured to receive a plurality of left read senses and a plurality of right read senses for the plurality of cells of a wordline, determine a plurality of first windows and a plurality of second windows, determine a left window sum and a right window sum, determine a deviation parameter and a dispersion parameter based on the left window sum and the right window sum, and determine one or more characteristics of the plurality of cells based on the deviation parameter and the dispersion parameter. Each first window equals a sum of the plurality of left read senses minus an expectation constant. Each second window equals a sum of the plurality of right read senses minus the expectation constant. The left window sum equals a sum of the plurality of first windows and the right window sum equals a sum of the plurality of second windows.

In another embodiment, a data storage device includes a memory device including a plurality of wordlines, each wordline having a plurality of cells, and a cell statistics generator (CSG) disposed on the memory device. The CSG includes logic configured to determine a deviation parameter and a dispersion parameter for the plurality of cells of a wordline of the plurality of wordlines and generate one or more characteristics based on the deviation parameter and the dispersion parameter for optimization and tuning of the plurality of cells of the wordline.

In another embodiment, a data storage device includes a memory means including a plurality of wordlines, each wordline having a plurality of cells, and one or more cell statistics generators (CSGs) disposed on the memory means. Each CSG of the one or more CSGs includes logic configured to receive a plurality of left read senses and a plurality of right read senses for the plurality of cells of a wordline of the plurality of wordlines, determine a deviation parameter and a dispersion parameter based on the received plurality of left read senses and the plurality of right read senses, and generate one or more characteristics based on the deviation parameter and the dispersion parameter for optimization and tuning of the plurality of cells of the wordline. The plurality of left read senses is partitioned by a number of cells and the plurality of right read senses is partitioned by the number of cells.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

In the following, reference is made to embodiments of the disclosure. However, it should be understood that the disclosure is not limited to specifically described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments, and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered to be an element or limitation of the appended claims except where explicitly recited in a claim(s).

The present disclosure generally relates to error detection in a non-volatile memory (NVM) device, and more particularly, to setting voltage read levels in an NVM device. A data storage device includes a memory device including a plurality of wordlines, each wordline having a plurality of cells, and a cell statistics generator (CSG) disposed on the memory device. The CSG includes logic configured to receive a plurality of left read senses and a plurality of right read senses for the plurality of cells of a wordline, determine a plurality of first windows and a plurality of second windows, determine a left window sum and a right window sum, determine a deviation parameter and a dispersion parameter based on the left window sum and the right window sum, and determine one or more characteristics of the plurality of cells based on the deviation parameter and the dispersion parameter. The deviation parameter and the dispersion parameter are used to describe a number of errors of the left read sense and the right read sense.

Figure 1:
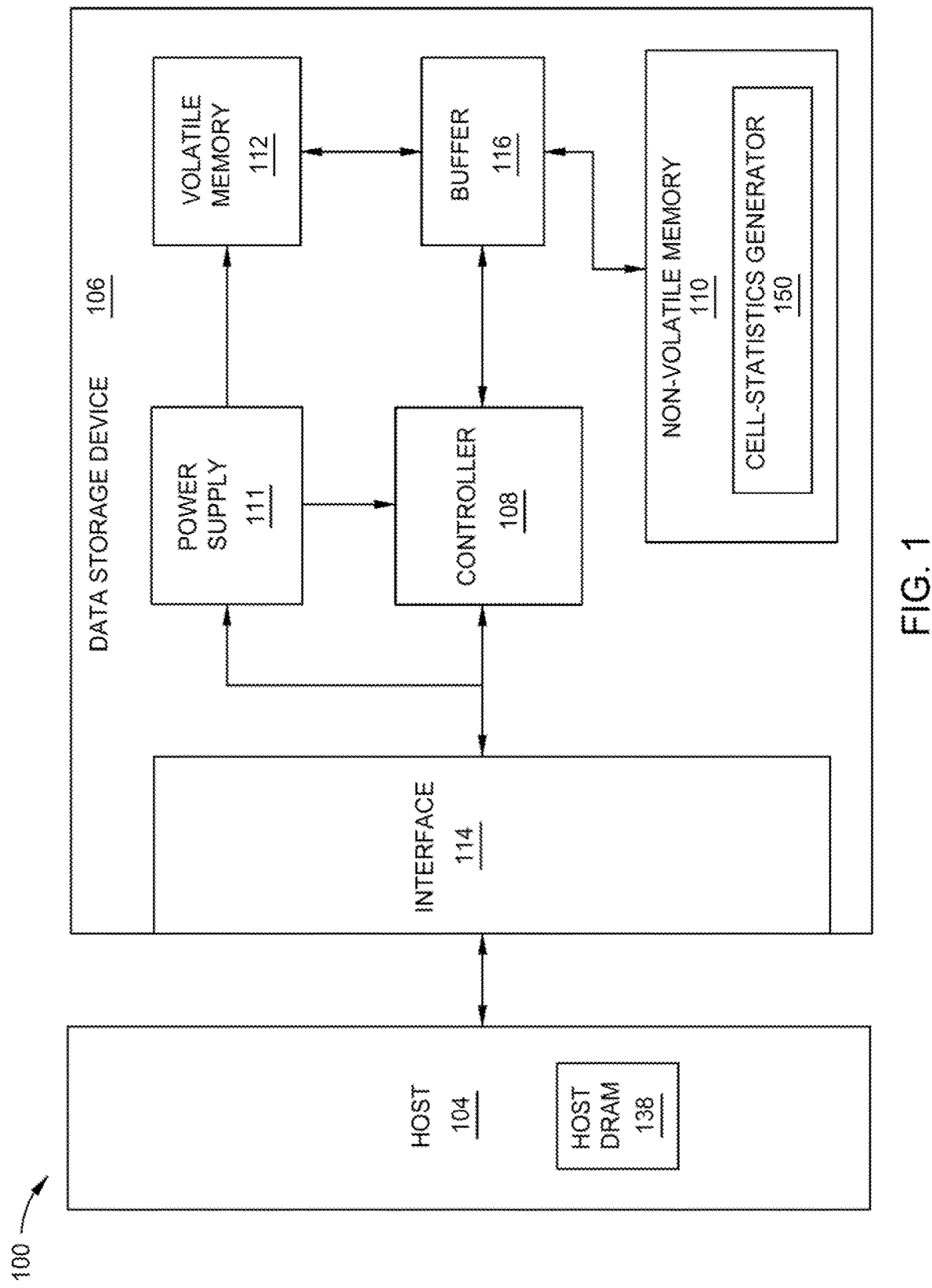
FIG. 1 is a schematic block diagram illustrating a storage system in which a data storage device may function as a storage device for a host device, according to certain embodiments.

FIG. 1 is a schematic block diagram illustrating a storage system 100 in which a host device 104 is in communication with a data storage device 106, according to certain embodiments. For instance, the host device 104 may utilize a non-volatile memory (NVM) 110 included in data storage device 106 to store and retrieve data. The host device 104 comprises a host DRAM 138. In some examples, the storage system 100 may include a plurality of storage devices, such as the data storage device 106, which may operate as a storage array. For instance, the storage system 100 may include a plurality of data storage devices 106 configured as a redundant array of inexpensive/independent disks (RAID) that collectively function as a mass storage device for the host device 104.

The host device 104 may store and/or retrieve data to and/or from one or more storage devices, such as the data storage device 106. As illustrated in FIG. 1, the host device 104 may communicate with the data storage device 106 via an interface 114. The host device 104 may comprise any of a wide range of devices, including computer servers, network-attached storage (NAS) units, desktop computers, notebook (i.e., laptop) computers, tablet computers, set-top boxes, telephone handsets such as so-called "smart" phones, so-called "smart" pads, televisions, cameras, display devices, digital media players, video gaming consoles, video streaming device, or other devices capable of sending or receiving data from a data storage device.

The data storage device 106 includes a controller 108, NVM 110, a power supply 111, volatile memory 112, the interface 114, and a write buffer 116. In some examples, the data storage device 106 may include additional components not shown in FIG. 1 for the sake of clarity. For example, the data storage device 106 may include a printed circuit board (PCB) to which components of the data storage device 106 are mechanically attached and which includes electrically conductive traces that electrically interconnect components of the data storage device 106 or the like. In some examples, the physical dimensions and connector configurations of the data storage device 106 may conform to one or more standard form factors. Some example standard form factors include, but are not limited to, 3.5" data storage device (e.g., an HDD or SSD), 2.5" data storage device, 1.8" data storage device, peripheral component interconnect (PCI), PCI-extended (PCI-X), PCI Express (PCIe) (e.g., PCIe x1, x4, x8, x16, PCIe Mini Card, MiniPCI, etc.). In some examples, the data storage device 106 may be directly coupled (e.g., directly soldered or plugged into a connector) to a motherboard of the host device 104.

Interface 114 may include one or both of a data bus for exchanging data with the host device 104 and a control bus for exchanging commands with the host device 104. Interface 114 may operate in accordance with any suitable protocol. For example, the interface 114 may operate in accordance with one or more of the following protocols: advanced technology attachment (ATA) (e.g., serial-ATA (SATA) and parallel-ATA (PATA)), Fibre Channel Protocol (FCP), small computer system interface (SCSI), serially attached SCSI (SAS), PCI, and PCIe, non-volatile memory express (NVMe), OpenCAPI, GenZ, Cache Coherent Interface Accelerator (CCIX), Open Channel SSD (OCSSD), or the like. Interface 114 (e.g., the data bus, the control bus, or both) is electrically connected to the controller 108, providing an electrical connection between the host device 104 and the controller 108, allowing data to be exchanged between the host device 104 and the controller 108. In some examples, the electrical connection of interface 114 may also permit the data storage device 106 to receive power from the host device 104. For example, as illustrated in FIG. 1, the power supply 111 may receive power from the host device 104 via interface 114.

The NVM 110 may include a plurality of memory devices or memory units. NVM 110 may be configured to store and/or retrieve data. For instance, a memory unit of NVM 110 may receive data and a message from controller 108 that instructs the memory unit to store the data. Similarly, the memory unit may receive a message from controller 108 that instructs the memory unit to retrieve data. In some examples, each of the memory units may be referred to as a die. In some examples, the NVM 110 may include a plurality of dies (i.e., a plurality of memory units). In some examples, each memory unit may be configured to store relatively large amounts of data (e.g., 128 MB, 256 MB, 512 MB, 1 GB, 2 GB, 4 GB, 8 GB, 16 GB, 32 GB, 64 GB, 128 GB, 256 GB, 512 GB, 1 TB, etc.).

In some examples, each memory unit may include any type of non-volatile memory devices, such as flash memory devices, phase-change memory (PCM) devices, resistive random-access memory (ReRAM) devices, magneto-resistive random-access memory (MRAM) devices, ferroelectric random-access memory (F-RAM), holographic memory devices, and any other type of non-volatile memory devices.

The NVM 110 may comprise a plurality of flash memory devices or memory units. NVM Flash memory devices may include NAND or NOR-based flash memory devices and may store data based on a charge contained in a floating gate of a transistor for each flash memory cell. In NVM flash memory devices, the flash memory device may be divided into a plurality of dies, where each die of the plurality of dies includes a plurality of physical or logical blocks, which may be further divided into a plurality of pages. Each block of the plurality of blocks within a particular memory device may include a plurality of NVM cells. Rows of NVM cells may be electrically connected using a word line to define a page of a plurality of pages. Respective cells in each of the plurality of pages may be electrically connected to respective bit lines. Furthermore, NVM flash memory devices may be 2D or 3D devices and may be single level cell (SLC), multi-level cell (MLC), triple level cell (TLC), or quad level cell (QLC). The controller 108 may write data to and read data from NVM flash memory devices at the page level and erase data from NVM flash memory devices at the block level.

The NVM 110 includes a cell statistics generator (CSG) 150. The CSG 150 is embedded in the NVM 110 in order to add arithmetic addition elements to the NVM 110. For example, the CSG 150 may be embedded in each NVM die of the NVM 110. The CSG 150 may assist with the optimization and the tuning of each NVM die. For example, the CSG 150 may allow parallel processing of dies in order for more efficient recovery and operations of the data storage device 106. In other embodiments, the CSG 150 may be implemented in the controller 108 or in a CMOS architecture, such as CMOS under the array (CUA), CMOS bonded array (CbA), or CMOS above the array (CAA)

The power supply 111 may provide power to one or more components of the data storage device 106. When operating in a standard mode, the power supply 111 may provide power to one or more components using power provided by an external device, such as the host device 104. For instance, the power supply 111 may provide power to the one or more components using power received from the host device 104 via interface 114. In some examples, the power supply 111 may include one or more power storage components configured to provide power to the one or more components when operating in a shutdown mode, such as where power ceases to be received from the external device. In this way, the power supply 111 may function as an onboard backup power source. Some examples of the one or more power storage components include, but are not limited to, capacitors, super-capacitors, batteries, and the like. In some examples, the amount of power that may be stored by the one or more power storage components may be a function of the cost and/or the size (e.g., area/volume) of the one or more power storage components. In other words, as the amount of power stored by the one or more power storage components increases, the cost and/or the size of the one or more power storage components also increases.

The volatile memory 112 may be used by controller 108 to store information. Volatile memory 112 may include one or more volatile memory devices. In some examples, controller 108 may use volatile memory 112 as a cache. For instance, controller 108 may store cached information in volatile memory 112 until the cached information is written to the NVM 110. As illustrated in FIG. 1, volatile memory 112 may consume power received from the power supply 111. Examples of volatile memory 112 include, but are not limited to, random-access memory (RAM), dynamic random access memory (DRAM), static RAM (SRAM), and synchronous dynamic RAM (SDRAM (e.g., DDR1, DDR2, DDR3, DDR3L, LPDDR3, DDR4, LPDDR4, and the like)).

Controller 108 may manage one or more operations of the data storage device 106. For instance, controller 108 may manage the reading of data from and/or the writing of data to the NVM 110. In some embodiments, when the data storage device 106 receives a write command from the host device 104, the controller 108 may initiate a data storage command to store data to the NVM 110 and monitor the progress of the data storage command. Controller 108 may determine at least one operational characteristic of the storage system 100 and store at least one operational characteristic in the NVM 110. In some embodiments, when the data storage device 106 receives a write command from the host device 104, the controller 108 temporarily stores the data associated with the write command in the internal memory or write buffer 116 before sending the data to the NVM 110.

Figure 2A:
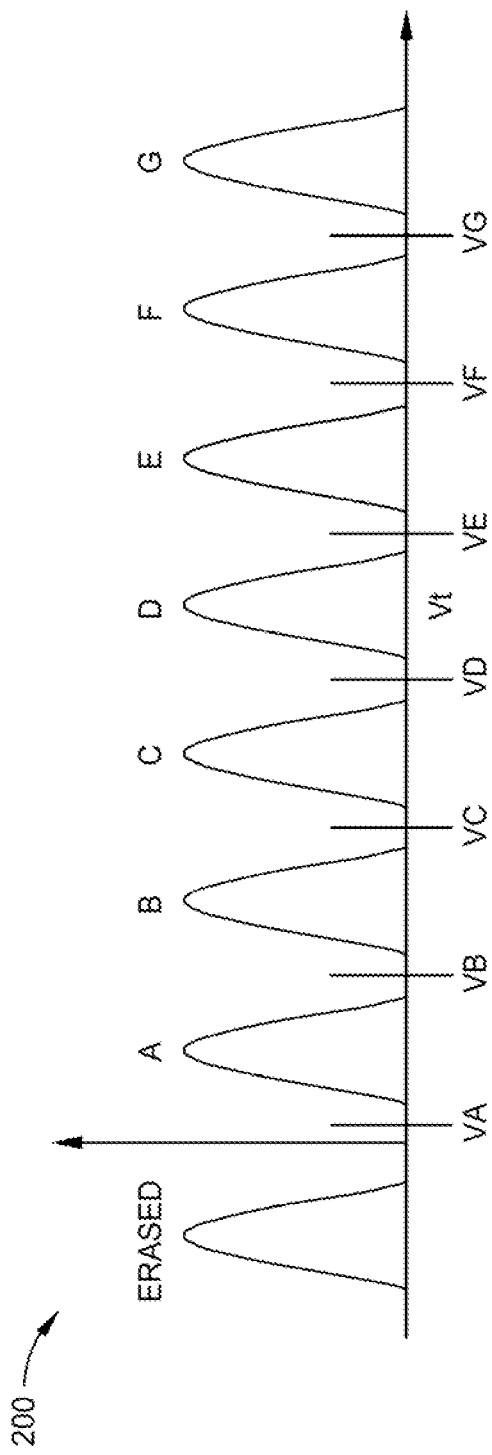
FIG. 2A is a graph illustrating threshold voltages for TLC memory, according to certain embodiments.

FIG. 2A is a graph 200 illustrating threshold voltages for TLC memory, according to certain embodiments. TLC memory includes 3 bits, where each bit may have a program state of either 0 or 1. The program state refers to the state of the memory cell, whether the memory cell is empty (i.e., no data exists) or the memory cell is programmed (i.e., data exists). Furthermore, the number of unique combinations of program states can be solved in the following equation: (Total number of voltage levels)=2^(number of bits per memory cell). For the TLC memory, the number of voltage levels is eight because 2^3=8.

As the number of bits of the memory cell increases, the memory cell can record more information leading to larger data storage. Furthermore, the equation for the unique combination of program states may be applied to SLC memory, TLC memory, QLC memory, penta-layer cell (PLC) memory, and other higher iterations of layer cell memory.

The program state of 0 refers to a programmed state, whereas the program state of 1 refers to an erased state. The TLC memory has 8 voltage levels, where one is erased and seven are programmed. Furthermore, the one voltage level that is erased has a bit combination of program state 111, according to certain embodiments. For any memory cell, if the bit combination only contains the program state 1, then the program state is erased (e.g., 1 for SLC, 11 for MLC, and 1111 for QLC). Listing from lowest threshold voltage, denoted by Vt on the x-axis, to highest threshold voltage in FIG. 2A, the voltage levels are 111 for the erased cell state, 110 for cell state A, 100 for cell state B, 000 for cell state C, 010 for cell state D, 011 for cell state E, 001 for cell state F, and 101 for cell state G, according to certain embodiments.

The bits for the cell state (e.g., ###) are upper page, middle page, lower page. Furthermore, the lines between the curves are labeled VA, VB, VC, VD, VE, VF, and VG are related to the threshold or reference voltage. For other memory cells, the number of threshold or reference voltages can be solved by the following equation: (number of threshold or reference voltages)=(total number of voltage levels)−1. The individual pages of data can be read by performing a number of comparisons at one or more threshold points and determining whether the cell voltage is lower or higher than the threshold.

Figure 2B:
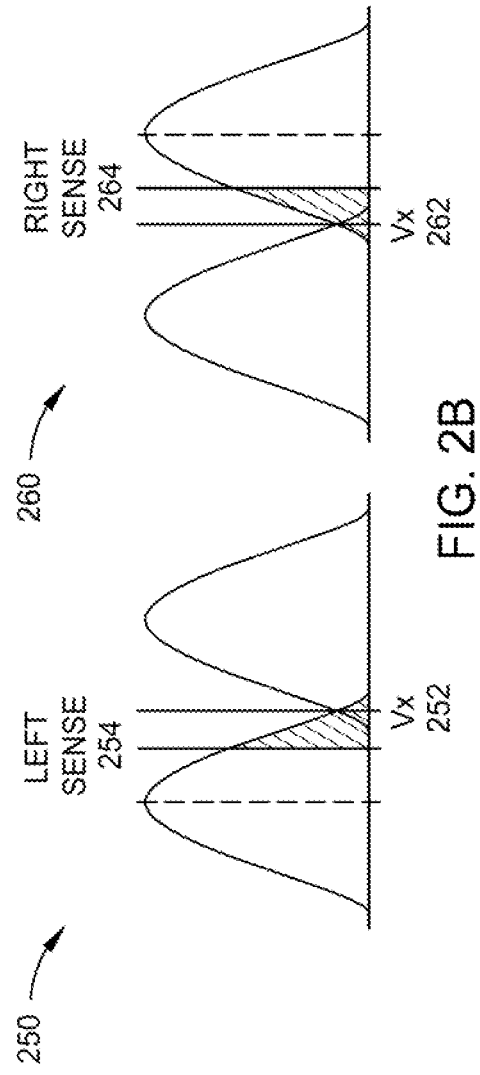
FIG. 2B are graphs illustrating a left sense and a right sense, according to certain embodiments.

FIG. 2B are graphs 250, 260 illustrating a left sense 254 and a right sense 264, according to certain embodiments. Vx 252, 262 are thresholds or reference voltages (i.e., a hard decode threshold), such as VA, VB, VC, VD, VE, VF, and VG of FIG. 2A. In the example described herein, Vx 252, 262 may be VD of FIG. 2A, such that cell state C is to the left of Vx 252, 262 and cell state D is to the right of Vx 252, 262. For simplification purposes herein, Vx 252 and Vx 262 are equal voltage values. However, in some embodiments, Vx 252 and Vx 262 are different voltage values, such as when either or both Vx 252 and Vx 262 are adjusted by a calculated deviation value (described below). When executing a sense at the threshold or reference voltage, the sense may be split into the left sense 254 (shown in graph 250) and the right sense 264 (shown in graph 260).

Likewise, the left sense 254 and the right sense 264 may be executed and read by a hard decode, such as a sense amplifier. The left sense 254 and the right sense 264 are iteratively executed (i.e., the error area is calculated) up to a 0.25 threshold offset (i.e., quarter bin spacing) from the mean voltage of the relevant cell state indicated by a dashed line. For example, the left sense 254 may be completed one or more times at a left read sense voltage, where the left read sense voltage moves further from the threshold or reference voltage at each increasing iteration. The left sense 254 and the right sense 264 may output an error or an error rate for the respective sense (e.g., the left sense 254 is used to determine the error or error rate for the cell state to the left of Vx 252).

The 0.25 threshold offset may be determined by a Q-function (e.g., $Q(x,\mu,\sigma)$), where the Q-function equals 0.5 for any sigma. The sensing between two Gaussian distributions spaced one bin apart and with a common sigma may be represented as: $Sense(x,\sigma)=[1-Q(x,0.5,\sigma)]-Q(x,-0.5,\sigma)$. Therefore, using sense offsets of 0.25 (i.e., quarter bin spacing) leads to the end points of the transfer function being fixed and the transfer function slope, independent of the sigma, substantially equal to about 2. By executing the left sense 254 and the right sense 264 and the 0.25 threshold offset, the error (i.e., the threshold overlap between the cell state) of the adjacent relevant cell state is effectively 0. For example, the left sense 254 may cause the error of the cell state to the right of the Vx 252 to effectively be 0. In the description herein, reference to a left sense and a right sense refers to an error voltage value determined by the respective sense (e.g., the left sense 254 or the right sense 264).

A dispersion output or signal may be the difference of the right sense 264 and the left sense 254. The dispersion output or signal may be calculated as: $Dispersion=Sense(x+0.25,\sigma)-Sense(x-0.25,\sigma)$. A deviation output or signal may be the sum of the right sense 264 and the left sense 254. The deviation output or signal may be calculated as: $Deviation=Sense(x+0.25,\sigma)+Sense(x-0.25,\sigma)$.

Figure 3:
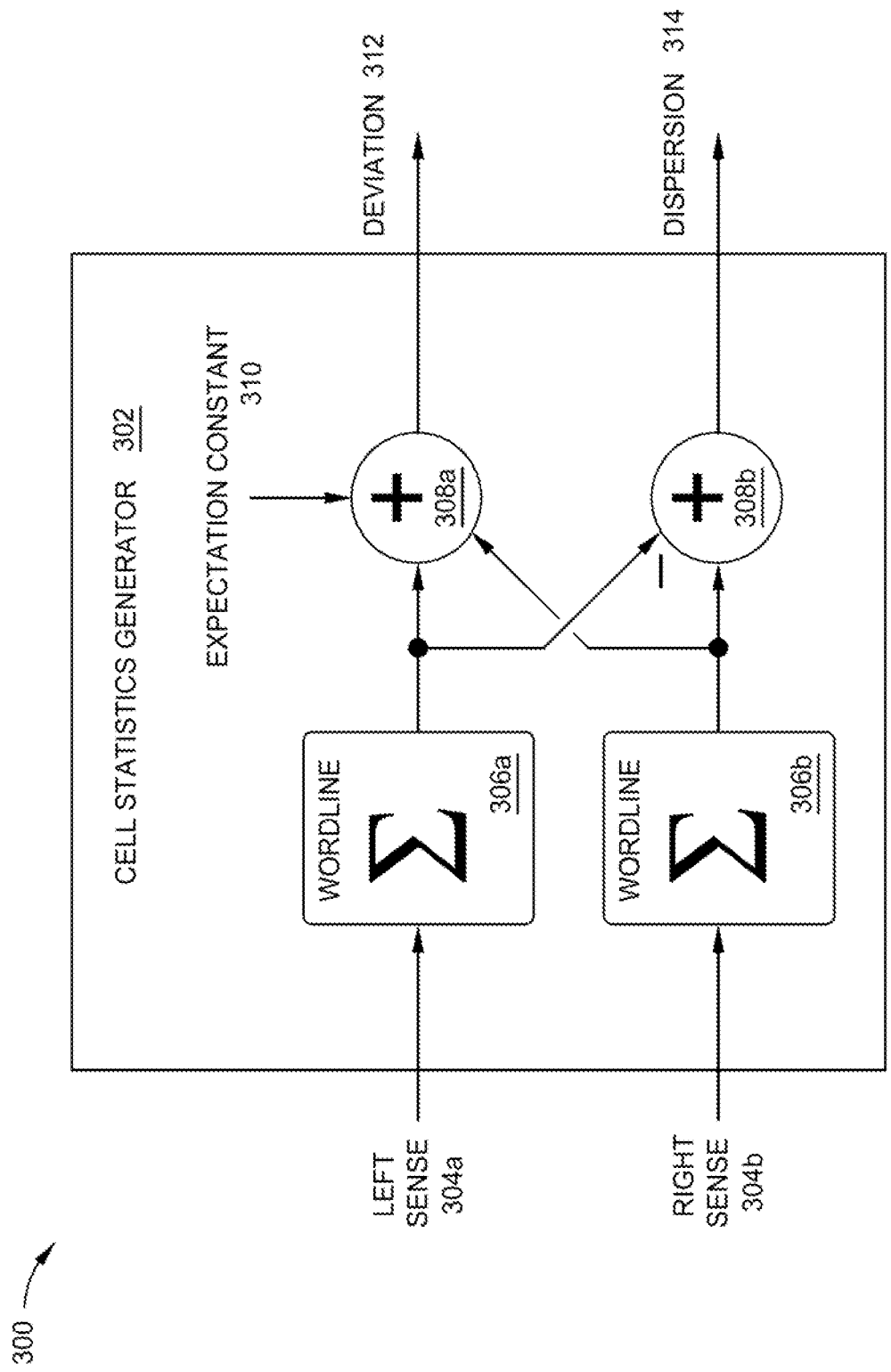
FIG. 3 is a schematic block diagram illustrating a cell statistics generator, according to certain embodiments.

FIG. 3 is a schematic block diagram 300 illustrating a CSG 302, according to certain embodiments. The CSG 302 may be the CSG 150 of FIG. 1. The CSG 302 receives a left sense 304a and a right sense 304b for a wordline of an NVM, such as the NVM 110 of FIG. 1. The left sense 304a may be the left sense 254, and the right sense 304b may be the right sense 264 of FIG. 2B. Because the left sense 304a and the right sense 304b are iterative senses, the plurality of left senses are accumulated at a first adder 306a for cells of a wordline of the NVM 110, and the plurality of right senses are accumulated at a second adder 306b for the same cells of the wordline of the NVM 110.

The accumulated left senses and the accumulated right senses are combined in a first combiner 308a operating in an additive mode with an expectation constant 310 (i.e., accumulated senses plus the expectation constant 310) to calculate a deviation output 312 and a second combiner 308b operating in a subtractive mode (i.e., accumulated senses minus the expectation constant 310) with the expectation constant 310 to calculate a dispersion output 314. The expectation constant 310 is a constant representing an expected accumulation value if read sense thresholds were optimal, and distributions very narrow. For example:

(1) Let N=total number of bins=$2^{\wedge}$bits_per_cell; by way of example, a TLC has $2^{\wedge}3=8$ bins and $8-1=7$ thresholds
(2) let i=threshold index tested=1 to (N-1)
(3) Expectation constant (EXP)=(i/N)*2*wordline_length; a wordline_length may be 16 kBytes per page (16384*8=131072 cells per wordline)"

The deviation output 312 is a zero-based linear error metric for shifting read sense voltage parameters to voltage levels optimal for detecting errors of cells of a wordline in a manner that minimizes false positive/negative error detection, and the dispersion output 314 represents an error count metric at a compressed bin spacing and is operable to shift read sense voltage levels while maintaining spacing between the left and right read senses. For example, adapting the threshold voltage shift parameters may include shifting the threshold voltage by an offset, such that the threshold voltage is substantially even in distance (e.g., voltage difference) from the adjacent cell states. The compressed bin spacing may be based on the relevant threshold offset (e.g., the 0.25 threshold offset).

Figure 4:
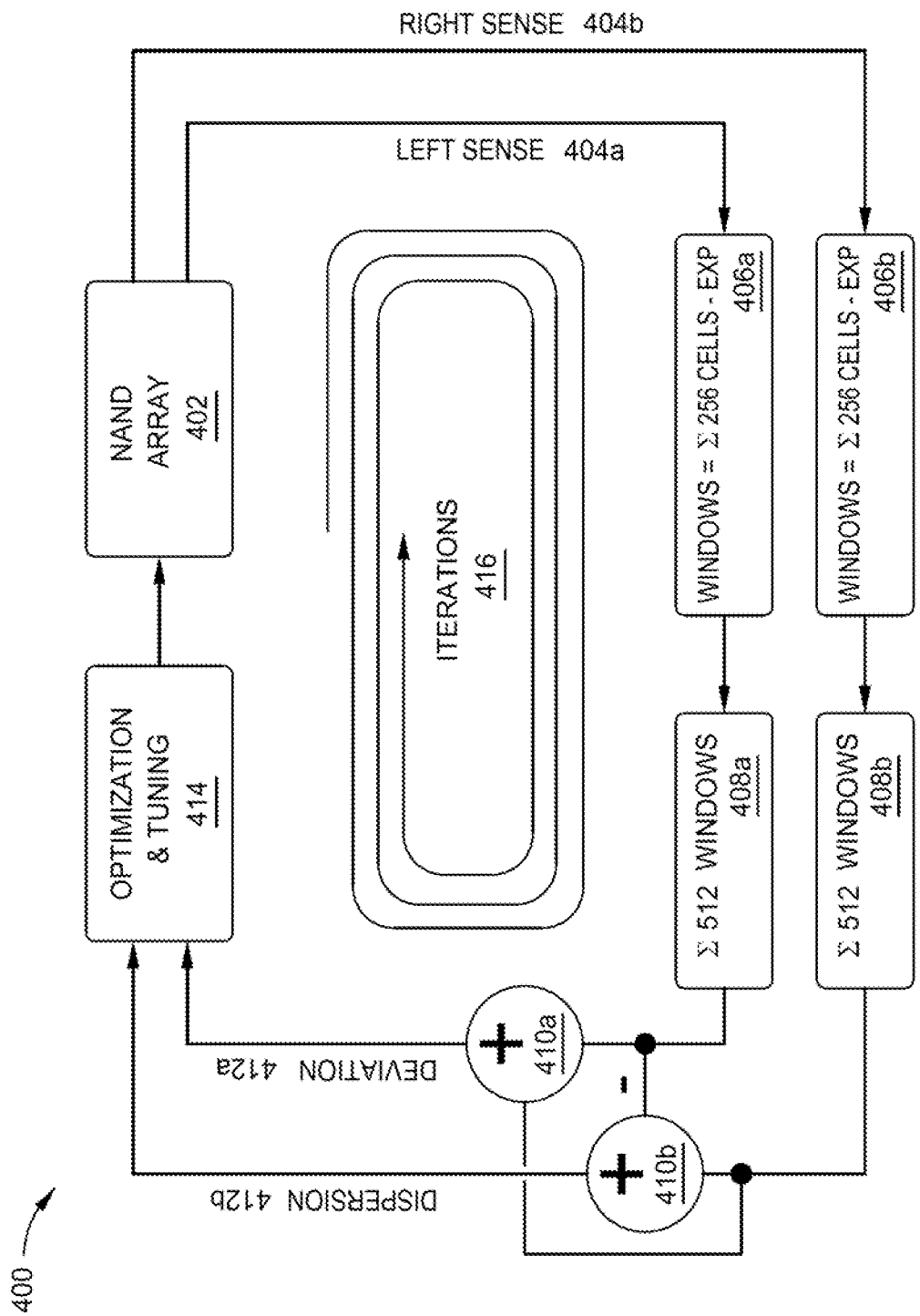
FIG. 4 is a flow diagram illustrating the operation of a cell statistics generator, according to certain embodiments.

FIG. 4 is a flow diagram 400 illustrating the operation of a CSG, such as the CSG 302 of FIG. 3, according to certain embodiments. A left sense 404a and a right sense 404b are executed on a wordline to determine a relevant threshold voltage of a NAND array 402 (e.g., sensing a cell state of the wordline). Although shown as both a left sense 404a and a right sense 404b, the senses may be decoupled, such that each sense is completed independently of each other and the accumulated sense is stored in a table to be used after both the left sense 404a and the right sense 404b have been completed. It is to be understood that in the description herein, a left read sense produces a negative result and a right read sense produces a positive result, where the results of the left read sense and the right read sense are calculated relative to the threshold voltage. A first adder 406a sums the left sense 404a for each of the cells of a wordline (e.g., 256 cells) and subtracts an expectation constant, such as the expectation constant 310 of FIG. 3, from the summation result. Likewise, a second adder 406b sums the right sense 404b for each of the cells and subtracts the expectation constant from the summation result.

After the first adder 406a and the second adder 406b adds the respective senses (i.e., the left sense 404a and the right sense 404b), each of the windows resulting from the first adder 406a and the second adder 406b are summed (e.g., the sum of 512 windows) at a respective third adder 408a and a respective fourth adder 408b. The results of the third adder 408a and the fourth adder 408b are combined at a first combiner 410a and at a second combiner 410b.

The first combiner 410a operates in an additive mode to calculate a deviation output 412a. The additive mode utilizes signed values (i.e., includes both negative and positive integers). In some embodiments, the first combiner 410a adds the accumulated left read sense values of the fourth adder 408*b* to the accumulated right read sense values of the third adder 408*a* and subtracts an expectation constant to obtain a signed value. Referring to the example above, the expectation constant is (i/N)*256 for each of the first adder 406*a* and second adder 406*b*. Based on the resulting value of the first combiner 410*a*, the left read sense and right read sense are shifted together to the left (negative voltage direction) or to the right (positive voltage direction) as a pair. For example, if the deviation output 412*a* is negative, indicating an error in the negative direction, then the voltage of the left sense and the right sense are shifted in the positive voltage direction in order to reduce the error. If the deviation output 412*a* is positive, indicating an error in the possible direction, then the voltage of the left sense and the right sense are shifted in the negative voltage direction in order to reduce the error.

The second combiner 410*b* operates in a subtractive mode to calculate a dispersion output 412*b*, representing a total number of errors at a compressed bin spacing, by changing the sign of, and subtracting the accumulated left read sense values of the fourth adder 408*b* from the accumulated right read sense values of the third adder 408*a* to obtain a positive value. This positive value is used to determine the distance between the left read sense and right read sense. A target value T of total number of errors may be set to 10% of the total senses accumulated (e.g., 2*wordline_length). The subtractive mode utilizes unsigned values (i.e., includes only positive integers). The dispersion output 412*b* describes a bin adjustment of the left sense and the right sense. The bin may be described as a percentage of a voltage curve for the respective cell state that the left read sense or the right read sense is executed at. For example, if the dispersion output 412*b* is less than the desired T target value, indicating a distance between left and right senses being too small, the left sense is moved further left while the right sense is moved further right in order to increase the distance between left and right senses. If the dispersion output 412*b* is greater than the desired CT target value, indicating a distance between left and right senses being too large, the left sense is moved toward the right while the right sense is moved toward the left in order to decrease the distance between left and right senses.

The deviation output 412*a* and the dispersion output 412*b* are provided to an optimization and tuning unit 414. The optimization and tuning unit 414 is configured to adjust the right and left sense voltages as well as adjust the compressed bin spacing of the relevant area for cells in a wordline. For example, the deviation output 412*a* is utilized to adjust the left and/or right read sense voltage, and the dispersion output 412*b* is used to adjust the compressed bin spacing (i.e., adjust the bin spacing of the cell state to the left of the threshold and the bin spacing of the cell state to the right of the threshold). Thus, because the deviation output 412*a* and the dispersion output 412*b* are independent of each other, the right sense voltage and the left sense voltage may be adjusted such that the resulting left sense and the right sense are asymmetric from the hard decode value. The optimization and tuning of the NAND array 402 may require one or more iterations 416, such as three iterations, to achieve read threshold values that are optimized and tuned.

Figure 5:
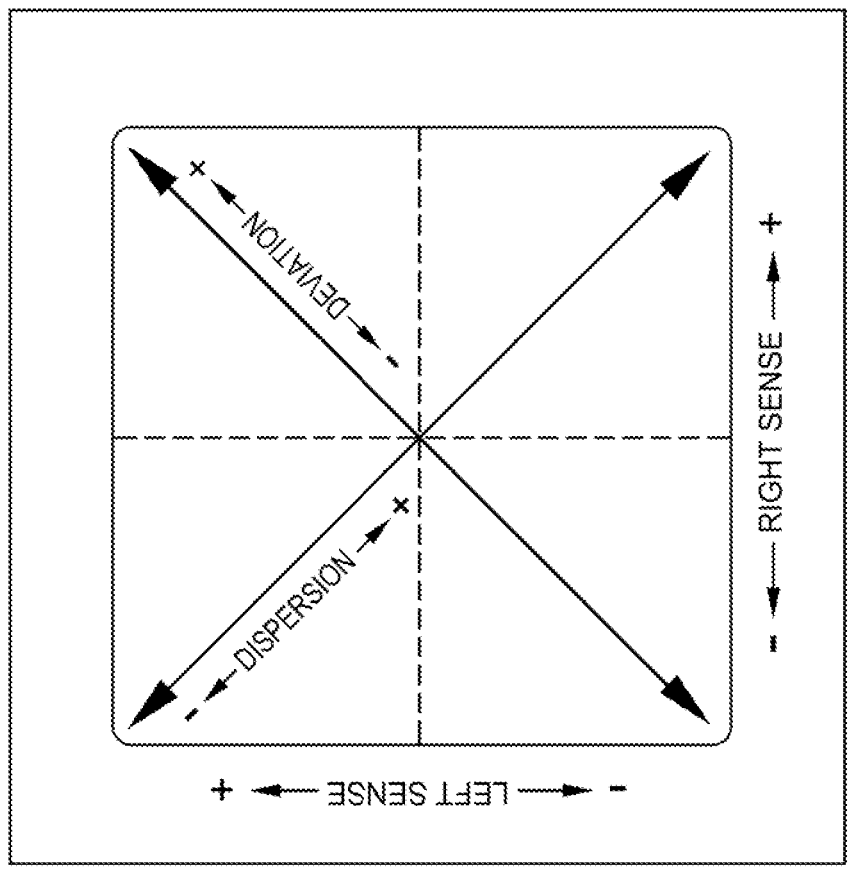
FIG. 5 is a graph illustrating dispersion-deviation based on a left sense and a right sense, according to certain embodiments.

FIG. 5 is a graph 500 illustrating dispersion-deviation based on a left sense and a right sense, according to certain embodiments. The right sense is the x-axis, and the left sense is the y-axis. The depicted plus (+) and minus (−) signs are indicative of a relatively higher (+) voltage versus a relatively lower (−) voltage, according to certain embodiments.

The deviation output is a zero-based linear error metric for adapting parameters. The dispersion output represents an error count metric at a compressed bin spacing. The deviation output and the dispersion output are substantially orthogonal to each other, in that adjusting one of the deviation output or the dispersion output has little effect on the other, according to certain embodiments. By way of example, for the graph 500, if left sense is too high and right sense is too high, then deviation output is positive; if left sense is too low and right sense is too low, then deviation output is negative; if left sense is too high and right sense is too low, then dispersion output is smaller (−); and if left sense is too low and right sense is too high, then dispersion output is larger (+). Thus, the dispersion output and the deviation output may be used to shift the left sense and the right sense asymmetrically, such that the left sense and the right sense are asymmetric from the hard decode value.

Figure 6:
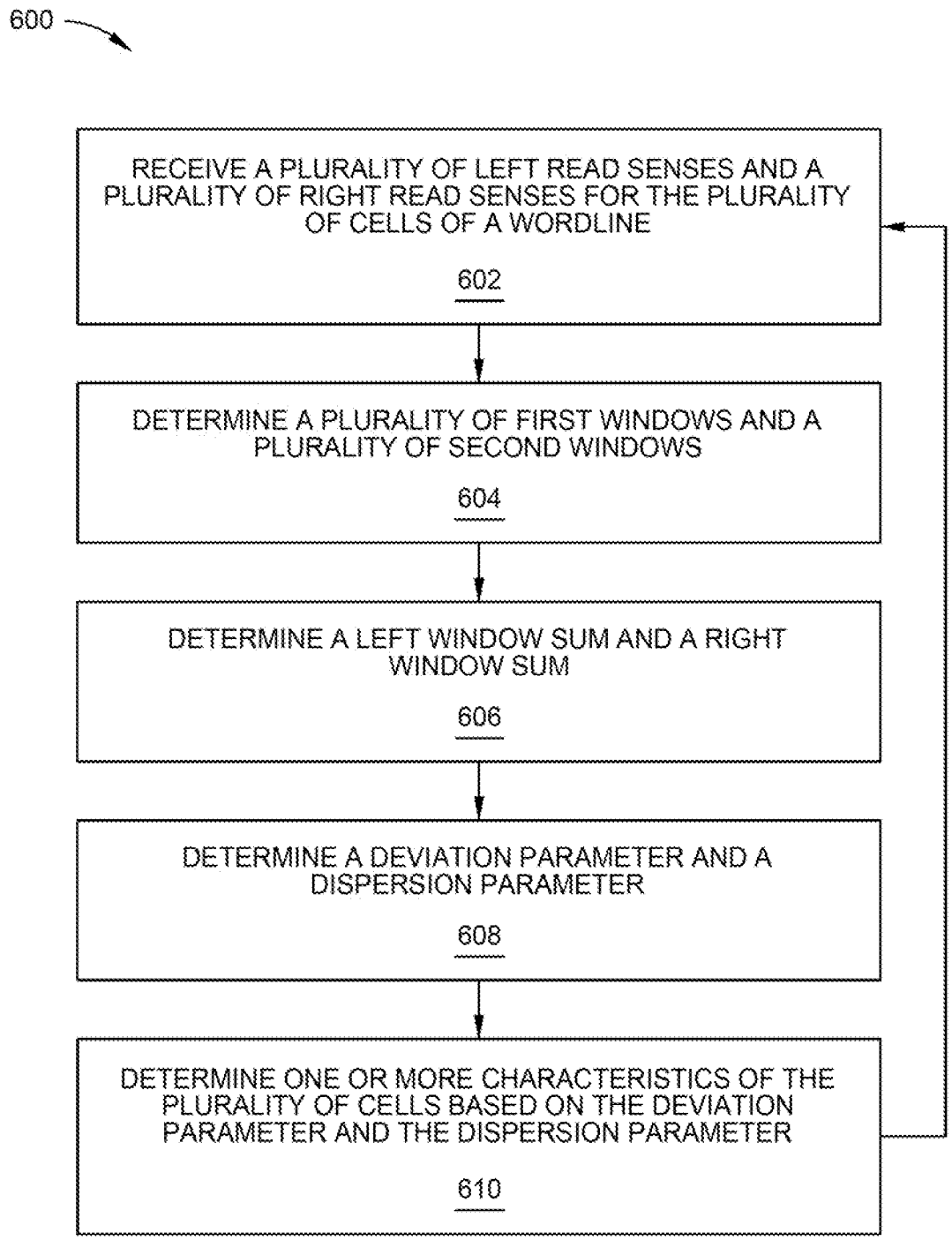
FIG. 6 is a flow diagram illustrating a method of determining one or more characteristics of a plurality of cells of a wordline, according to certain embodiments.

FIG. 6 is a flow diagram illustrating a method 600 of determining one or more characteristics of a plurality of cells of a wordline, according to certain embodiments. Method 600 may be implemented by a CSG, such as the CSG 150 of FIG. 1 or the CSG 302 of FIG. 3. Furthermore, method 600 may occur for each (or up to the same number of) threshold voltage of plurality of threshold voltages of the memory device. For example, TLC memory includes 7 threshold voltages. Thus, method 600 may be executed to optimize and tune each of the 7 threshold voltages of TLC memory. Although the processing of a plurality of left read senses and a plurality of right read senses are described in conjunction with each other herein, it is to be understood that the plurality of left read senses may be processed independently of or subsequently after the processing the plurality of right read senses and vice-versa. When processing either the plurality of left read senses or the plurality of right read senses, the plurality of read senses not being processed and the results of the processing may be stored in a buffer or a table of the CSG 150, 302 as part of the CSG block or positioned in a block on the NAND, separate from the CSG. Therefore, when a deviation parameter and a dispersion parameter is calculated, the CSG 150, 302 retrieves the stored processing results and determines the deviation parameter and the dispersion parameter utilizing the retrieved stored processing results.

At block 602, the CSG 150, 302 receives a plurality of left read senses at a first adder, such as the first adder 406*a* of FIG. 4, and a plurality of right read senses at a second adder, such as the second adder 406*b* of FIG. 4, for the plurality of cells of a wordline. Each left sense is at a left voltage that is less than a threshold voltage and each right sense is at a right voltage that is greater than the threshold voltage. For example, the threshold voltage may refer to any of the threshold voltages VA, VB, VC, etc. of FIG. 2A for a TLC memory device. Although a TLC memory device is used as an example, the embodiments described may be applied to other memory densities, such as SLC, MLC, QLC, PLC, and the like. The absolute value or unsigned value of the difference between the threshold voltage and the left voltage and the absolute value or unsigned value of the difference between the threshold voltage and the right voltage are substantially equal. The plurality of left read senses may be partitioned into groups of left read senses, each including a number of cells. Likewise, the plurality of right read senses may be partitioned into groups of right read senses, where each group includes the same number of cells or the same cells as the groups of left read senses. In one embodiment, the number of cells per group is about 256 cells.

At block 604, a plurality of first windows is determined by the first adder 406a and a plurality of second windows is determined by the second adder 406b. Each of the plurality of first windows is determined by summing the plurality of left read senses and subtracting an expectation constant, such as the expectation constant 310 of FIG. 3, from each of the summed groups. Likewise, each of the plurality of first windows is determined by summing the plurality of right read senses and subtracting the expectation constant 310 from each of the summed groups. Each of the plurality of first windows and each of the plurality of second windows are signed values, such that the plurality of first windows are negative and the plurality of second values are positive.

At block 606, a third adder, such as the third adder 408a of FIG. 4, receives each of the plurality of first windows from the first adder 406a and a fourth adder, such as the fourth adder 408b of FIG. 4, receives each of the plurality of second windows from the second adder 406b. In one example, the number of windows of the plurality of first windows is about 512 windows and the number of windows of the plurality of second windows is about 512 windows. In one embodiment, the number of windows is determined by the number of cells of the wordline divided by the number of cells per group. The third adder 408a sums the received plurality of first windows and the fourth adder 408b sums the received plurality of second windows. The summed plurality of first windows and the summed plurality of second windows are signed values, such that the summed plurality of first windows is negative and the summed plurality of second values is positive.

At block 608, the CSG 150, 302 determines a deviation parameter, such as the deviation output 412a of FIG. 4, at a first combiner, such as the first combiner 410a of FIG. 4, and a dispersion parameter, such as the dispersion output 412b of FIG. 4, at a second combiner, such as the second combiner 410b of FIG. 4. The first combiner 410a operates in an additive mode to calculate a deviation parameter. The additive mode utilizes signed values (i.e., includes both negative and positive integers). The deviation parameter is determined by adding the summed plurality of first windows and the summed plurality of second windows. The second combiner 410b operates in a subtractive mode to calculate the dispersion parameter. The subtractive mode produces in an unsigned value, such that the result is a non-negative integer. The dispersion parameter is determined by subtracting the summed plurality of second windows from the summed plurality of first windows. Thus, the difference between the summed plurality of second windows from the summed plurality of first windows is a positive number. The deviation parameter and the dispersion parameter may be utilized to asymmetrically shift the left read sense voltage and the right read sense voltage in an optimal manner, such that the left read sense voltage and the right read sense voltage are efficiently adapted based on the deviation parameter and the dispersion parameter. Thus, the left read sense voltage and the right read sense voltage may be optimized without testing each possible symmetric or asymmetric left read sense voltage and right read sense voltage combination.

At block 610, the CSG 150, 302 determines one or more characteristics of the plurality of cells of the wordline based on the deviation parameter and the dispersion parameter determined at block 610. According to certain embodiments, deviation output is used for finding an optimal threshold point between two adjacent bins. The dispersion output is used for determining the error margin in the system of a given NAND. Additional uses of deviation and dispersion output are for read threshold optimization, soft bit read optimization (e.g., adjustment of left and right read senses), NAND test time reduction by measuring error margin in the system of a given NAND, write program level optimization by measuring and allowing all the bins to set to equal or to calculated error margins, idle time and recovery adaptation since the CSG will provide proper measurement at the worst case circumstances of operation.

In one example, based on the dispersion parameter, the CSG 150, 302 determines a total number of errors at a compressed bin spacing. The compressed bin spacing is a metric that include both the bin spacing of the left read sense and the bin spacing of the right read sense. The larger the dispersion parameter, the greater the number of errors in the compressed bin spacing. Thus, by using the dispersion parameter, the bin spacing or the spacing between both the left read sense and the threshold voltage and the right read sense and the threshold voltage may be adjusted to minimize the total number of errors. By way of example, during write program level optimization, write programming levels are be optimized such that all cells have relatively balanced error margins. Measuring the dispersion output over all the read thresholds provides calculation of the relative bin margins and adjustment can then be made to rebalance the bin margins if necessary according to disclosed embodiments.

Furthermore, because the dispersion parameter is a total number of errors, the dispersion parameter may be utilized to determine whether a cell is viable for programming or non-viable for programming. A non-viable cell may be one that will result in a high bit error rate (BER), will not hold electrical charge, and the like. Thus, programming to a non-viable cell may lead to reduced data reliability.

In another example, the deviation parameter determines a zero-based linear error metric of the placement of the left read sense and the right read sense as well as a difference in the number of errors between the left read sense and the right read sense. Thus, by using the deviation parameter, the left read sense and the right read sense may be both shifted, by a substantially equal voltage, in the negative voltage direction or in the positive voltage direction based on the sign and amplitude of the deviation parameter.

Method 600 may iterate one or more times, such that the CSG 150, 302 re-receives a plurality of left read senses and a plurality of right read senses for the plurality of cells of the wordline at block 602, where the plurality of left read senses and the plurality of right read senses are executed at the adjusted left read sense voltages and the adjusted right read sense voltages based on the deviation parameter and the dispersion parameter. Each time the plurality of left read senses and the plurality of right read senses are re-received, the plurality of first windows and the plurality of second windows are re-determined at block 604, the summed plurality of left windows and the summed plurality of right windows are re-determined at block 606, the deviation parameter and the dispersion parameter are re-determined at block 608, and the one or more characteristics of the plurality of cells of the wordline are re-determined at block 610. In one embodiment, method 600 may iterate three times.

By determining a deviation parameter and a dispersion parameter based on a plurality of left read senses and a plurality of right read senses for a plurality of cells of a wordline, characteristics of the plurality of cells of the wordline may be determined. Thus, data reliability and performance of a data storage device may be improved.

In one embodiment, a data storage device includes a memory device including a plurality of wordlines, each wordline having a plurality of cells, and a cell statistics generator (CSG) disposed on the memory device. The CSG includes logic configured to receive a plurality of left read senses and a plurality of right read senses for the plurality of cells of a wordline, determine a plurality of first windows and a plurality of second windows, determine a left window sum and a right window sum, determine a deviation parameter and a dispersion parameter based on the left window sum and the right window sum, and determine one or more characteristics of the plurality of cells based on the deviation parameter and the dispersion parameter. Each first window equals a sum of the plurality of left read senses minus an expectation constant. Each second window equals a sum of the plurality of right read senses minus the expectation constant. The left window sum equals a sum of the plurality of first windows and the right window sum equals a sum of the plurality of second windows.

The logic is further configured to adjust a left voltage of the plurality of left read senses and a right voltage of the plurality of right read senses based on the deviation parameter and the dispersion parameter. The deviation parameter is determined by adding the left window sum and the right window sum and the dispersion parameter is determined by subtracting the right window sum from the left window sum. The deviation parameter and the dispersion parameter are independent of each other. The dispersion parameter is associated with a number of errors at a compressed bin spacing. The logic is further configured to adjust a bin spacing of a left read sense and a right read sense of a cell based on the dispersion parameter. The logic is further configured to adjust a read threshold by shifting a left read sense and a right read sense of a cell based on the deviation parameter. The logic is configured to determine the deviation parameter and the dispersion parameter and determine the one or more characteristics of the plurality of cells more than once. Each time the deviation parameter and the dispersion parameter and the one or more characteristics are determined, the logic is configured to re-receive the plurality of left read senses and the plurality of right read senses for the plurality of cells of the wordline, re-determine the plurality of first windows and the plurality of second windows, and re-determine the left window sum and the right window sum. The one or more characteristics comprises a number of errors, a bin spacing metric, and a read threshold metric.

In another embodiment, a data storage device includes a memory device including a plurality of wordlines, each wordline having a plurality of cells, and a cell statistics generator (CSG) disposed on the memory device. The CSG includes logic configured to determine a deviation parameter and a dispersion parameter for the plurality of cells of a wordline of the plurality of wordlines and generate one or more characteristics based on the deviation parameter and the dispersion parameter for optimization and tuning of the plurality of cells of the wordline.

The one or more characteristics comprises a number of errors, a bin spacing metric, and a read threshold metric. The one or more characteristics are utilized to shift a left read sense voltage and a right read sense voltage of a cell of the plurality of cells. The logic is further configured to accumulate a plurality of left read senses and a plurality of right read senses for a cell window of the plurality of cells of the wordline. The logic is further configured to generate a plurality of left windows and a plurality of right windows. Each of the plurality of left windows is a sum of the plurality of left read senses minus an expectation constant and each of the plurality of right windows is a sum of the plurality of right read senses minus the expectation constant. The cell window is equal to 256 cells. A number of the plurality of left windows equals 512 windows and a number of the plurality of right windows equals 512 windows. The logic is further configured to sum the plurality of left windows to generate a left window sum and sum the plurality of right windows to generate a right window sum. The logic is further configured to add the left window sum and the right window sum to determine the deviation parameter and subtract the right window sum from the left window sum to determine the dispersion parameter. The deviation parameter is a signed value. The dispersion parameter is an unsigned value.

In another embodiment, a data storage device includes a memory means including a plurality of wordlines, each wordline having a plurality of cells, and one or more cell statistics generators (CSGs) disposed on the memory means. Each CSG of the one or more CSGs includes logic configured to receive a plurality of left read senses and a plurality of right read senses for the plurality of cells of a wordline of the plurality of wordlines, determine a deviation parameter and a dispersion parameter based on the received plurality of left read senses and the plurality of right read senses, and generate one or more characteristics based on the deviation parameter and the dispersion parameter for optimization and tuning of the plurality of cells of the wordline. The plurality of left read senses is partitioned by a number of cells and the plurality of right read senses is partitioned by the number of cells.

The logic is further configured to subtract an expectation constant from a sum of the plurality of left read senses of each partition group of the plurality of left read senses to generate a plurality of left windows, add the plurality of left windows to generate a left window sum, subtract an expectation constant from a sum of the plurality of right read senses of each partition group of the plurality of right read senses to generate a plurality of right windows, and add the plurality of right windows to generate a right window sum. The logic is further configured to determine the deviation parameter by adding the left window sum and the right window sum and determine the dispersion parameter by subtracting the right window sum from the left window sum. The deviation parameter is a signed value. The dispersion parameter is an unsigned value While the foregoing is directed to embodiments of the present disclosure, other and further embodiments of the disclosure may be devised without departing from the basic scope thereof, and the scope thereof is determined by the claims that follow.

What is claimed is:

1. A data storage device, comprising:
  a memory device having a plurality of wordlines, each wordline having a plurality of cells; and
  a cell statistics generator (CSG) disposed on the memory device, the CSG comprising logic configured to:
    receive a plurality of left read senses and a plurality of right read senses for the plurality of cells of a wordline of the plurality of wordlines;
    determine a plurality of first windows and a plurality of second windows, wherein each first window equals a sum of the plurality of left read senses minus an expectation constant, and wherein each second window equals a sum of the plurality of right read senses minus the expectation constant;
    determine a left window sum and a right window sum, wherein the left window sum equals a sum of the plurality of first windows and the right window sum equals a sum of the plurality of second windows;

determine a deviation parameter and a dispersion parameter based on the left window sum and the right window sum; and determine one or more characteristics of the plurality of cells based on the deviation parameter and the dispersion parameter.

2. The data storage device of claim 1, wherein the logic is further configured to adjust a left voltage of the plurality of left read senses and a right voltage of the plurality of right read senses based on the deviation parameter and the dispersion parameter.

3. The data storage device of claim 1, wherein the deviation parameter is determined by adding the left window sum and the right window sum and the dispersion parameter is determined by subtracting the right window sum from the left window sum.

4. The data storage device of claim 3, wherein the deviation parameter and the dispersion parameter are independent of each other.

5. The data storage device of claim 3, wherein the dispersion parameter is associated with a number of errors at a compressed bin spacing.

6. The data storage device of claim 3, wherein the logic is further configured to adjust a bin spacing of a left read sense and a right read sense of a cell based on the dispersion parameter.

7. The data storage device of claim 3, wherein the logic is further configured to adjust a read threshold by shifting a left read sense and a right read sense of a cell based on the deviation parameter.

8. The data storage device of claim 1, wherein the logic is configured to determine the deviation parameter and the dispersion parameter and determine the one or more characteristics of the plurality of cells more than once.

9. The data storage device of claim 8, wherein, each time the deviation parameter and the dispersion parameter and the one or more characteristics are determined, the logic is configured to re-receive the plurality of left read senses and the plurality of right read senses for the plurality of cells of the wordline, re-determine the plurality of first windows and the plurality of second windows, and re-determine the left window sum and the right window sum.

10. The data storage device of claim 1, wherein the one or more characteristics comprises a number of errors, a bin spacing metric, and a read threshold metric.

11. A data storage device, comprising:
a memory device having a plurality of wordlines, each wordline comprising a plurality of cells; and
a cell statistics generator (CSG) disposed on the memory device, the CSG comprising logic configured to:
determine a deviation parameter and a dispersion parameter for the plurality of cells of a wordline of the plurality of wordlines; and
generate one or more characteristics based on the deviation parameter and the dispersion parameter for optimization and tuning of the plurality of cells of the wordline.

12. The data storage device of claim 11, wherein the one or more characteristics comprises a number of errors, a bin spacing metric, and a read threshold metric, and wherein the one or more characteristics are utilized to shift a left read sense voltage and a right read sense voltage of a cell of the plurality of cells.

13. The data storage device of claim 11, wherein the logic is further configured to accumulate a plurality of left read senses and a plurality of right read senses for a cell window of the plurality of cells of the wordline.

14. The data storage device of claim 13, wherein the logic is further configured to generate a plurality of left windows and a plurality of right windows, and wherein each of the plurality of left windows is a sum of the plurality of left read senses minus an expectation constant and each of the plurality of right windows is a sum of the plurality of right read senses minus the expectation constant.

15. The data storage device of claim 14, wherein the cell window is equal to 256 cells, and wherein a number of the plurality of left windows equals 512 windows and a number of the plurality of right windows equals 512 windows.

16. The data storage device of claim 14, wherein the logic is further configured to sum the plurality of left windows to generate a left window sum and sum the plurality of right windows to generate a right window sum.

17. The data storage device of claim 14, wherein the logic is further configured to:
add the left window sum and the right window sum to determine the deviation parameter, wherein the deviation parameter is a signed value; and
subtract the right window sum from the left window sum to determine the dispersion parameter, wherein the dispersion parameter is an unsigned value.

18. A data storage device, comprising:
memory means having a plurality of wordlines, each wordline comprising a plurality of cells; and
one or more cell statistics generators (CSGs) disposed on the memory means, wherein each CSG of the one or more CSGs comprises logic configured to:
receive a plurality of left read senses and a plurality of right read senses for the plurality of cells of a wordline of the plurality of wordlines, wherein the plurality of left read senses is partitioned by a number of cells and the plurality of right read senses is partitioned by the number of cells;
determine a deviation parameter and a dispersion parameter based on the received plurality of left read senses and the plurality of right read senses; and
generate one or more characteristics based on the deviation parameter and the dispersion parameter for optimization and tuning of the plurality of cells of the wordline.

19. The data storage device of claim 18, wherein the logic is further configured to:
subtract an expectation constant from a sum of the plurality of left read senses of each partition group of the plurality of left read senses to generate a plurality of left windows;
add the plurality of left windows to generate a left window sum;
subtract an expectation constant from a sum of the plurality of right read senses of each partition group of the plurality of right read senses to generate a plurality of right windows; and
add the plurality of right windows to generate a right window sum.

20. The data storage device of claim 19, wherein the logic is further configured to:
determine the deviation parameter by adding the left window sum and the right window sum, wherein the deviation parameter is a signed value; and
determine the dispersion parameter by subtracting the right window sum from the left window sum, wherein the dispersion parameter is an unsigned value.

* * * * *